(12) United States Patent
Weber et al.

(10) Patent No.: US 6,660,082 B2
(45) Date of Patent: Dec. 9, 2003

(54) METHOD AND APPARATUS FOR DOPING A MELT WITH A DOPANT

(75) Inventors: Martin Weber, Kastl (DE); Erich Gmeilbauer, St. Pantaleon (AT); Robert Vorbuchner, Burghausen (DE); Walter Neumaier, Gumpersdorf (DE); Peter Vilzmann, Burghausen (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/782,999

(22) Filed: Feb. 14, 2001

(65) Prior Publication Data

US 2001/0015167 A1 Aug. 23, 2001

(30) Foreign Application Priority Data

Feb. 17, 2000 (DE) .......................... 100 07 179

(51) Int. Cl.[7] .............................................. C30B 15/04
(52) U.S. Cl. .................... 117/19; 117/200; 117/208; 117/214
(58) Field of Search .................... 117/19, 200, 208, 117/214

(56) References Cited

U.S. PATENT DOCUMENTS

| | | | | |
|---|---|---|---|---|
| 4,973,454 A | * | 11/1990 | Morioka et al. ............ | 422/249 |
| 5,360,480 A | * | 11/1994 | Altekruger .................. | 117/214 |
| 5,406,905 A | | 4/1995 | Yemane-Berhane et al. .. | 117/19 |
| 5,427,056 A | * | 6/1995 | Imai et al. .................. | 117/214 |
| 5,492,078 A | * | 2/1996 | Altekruger et al. .......... | 117/19 |
| 5,580,171 A | * | 12/1996 | Lim et al. ................... | 366/336 |
| 5,587,016 A | * | 12/1996 | Altekruger et al. ......... | 117/214 |
| 5,720,810 A | * | 2/1998 | Arai et al. ................... | 117/221 |
| 5,876,496 A | * | 3/1999 | Nagai et al. ................. | 117/33 |
| 5,900,055 A | * | 5/1999 | Nagai et al. ................. | 117/33 |
| 5,976,245 A | * | 11/1999 | Aydelott ...................... | 117/19 |
| 6,179,914 B1 | * | 1/2001 | Aydelott ..................... | 117/200 |

FOREIGN PATENT DOCUMENTS

| | | | |
|---|---|---|---|
| JP | 60-171291 | 9/1985 | |
| JP | 62-153188 | 7/1987 | C30B/15/104 |
| WO | 97/36024 | 10/1997 | |

OTHER PUBLICATIONS

Wolf et al., Silicon Processing for the VLSI Era vol. 1: Process Technology, Lattice Press, Sunset Beach, CA, USA, pp. 30–33, 1986.*

English Derwent Abstract AN 1987–230720 [33] corresponding to JP 62–153188.

English Derwent Abstract AN 1985–258959 [42] corresponding to JP 60–171291.

* cited by examiner

Primary Examiner—Nadine G. Norton
Assistant Examiner—Matthew Anderson
(74) Attorney, Agent, or Firm—Collard & Roe, P.C.

(57) ABSTRACT

A method for doping a melt with a dopant has the melt being provided in a crucible. The dopant is introduced into a vessel and the vessel is immersed in the melt, the dopant being transferred into the melt through an opening which forms in the vessel. There is also an apparatus which comprises a vessel containing the dopant and a device which is connected to the vessel, for lowering the vessel into a melt and for lifting the vessel out of the melt, the vessel being provided with an opening which is blocked by a closure piece which is of the same type of material as the melt and melts when it is brought into contact with the melt.

5 Claims, 3 Drawing Sheets

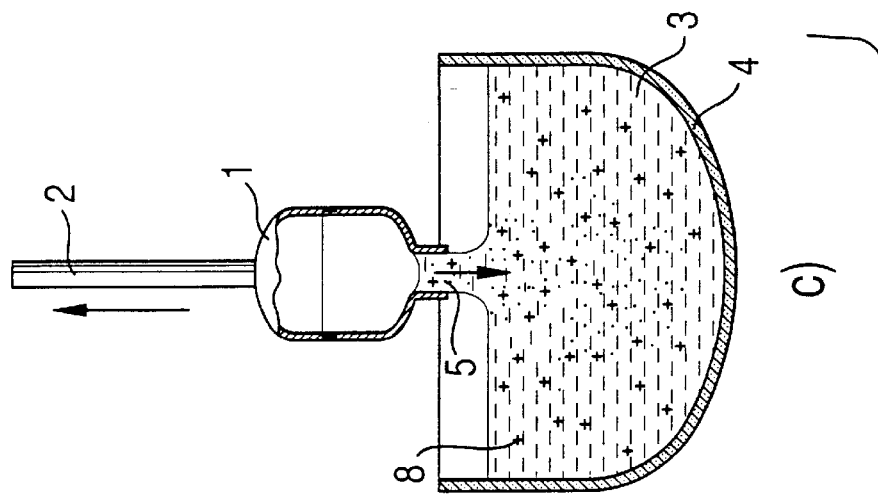
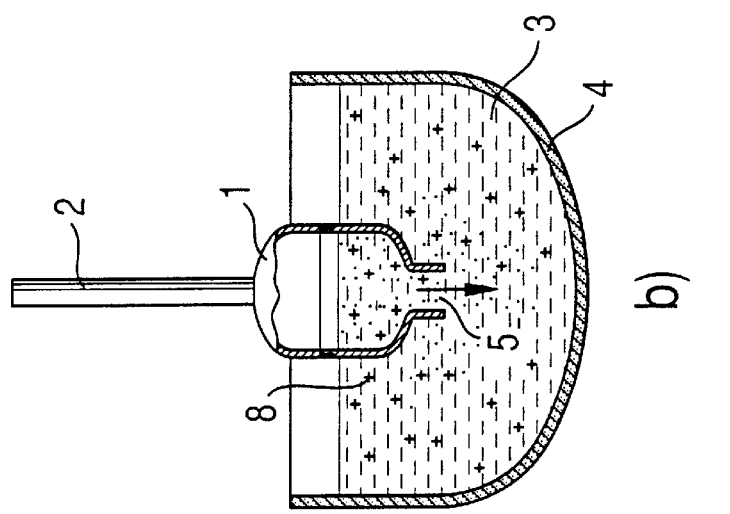
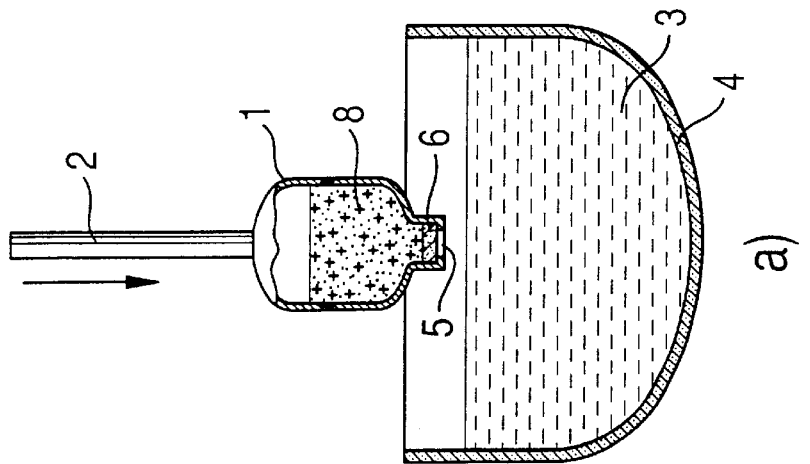
Fig. 1

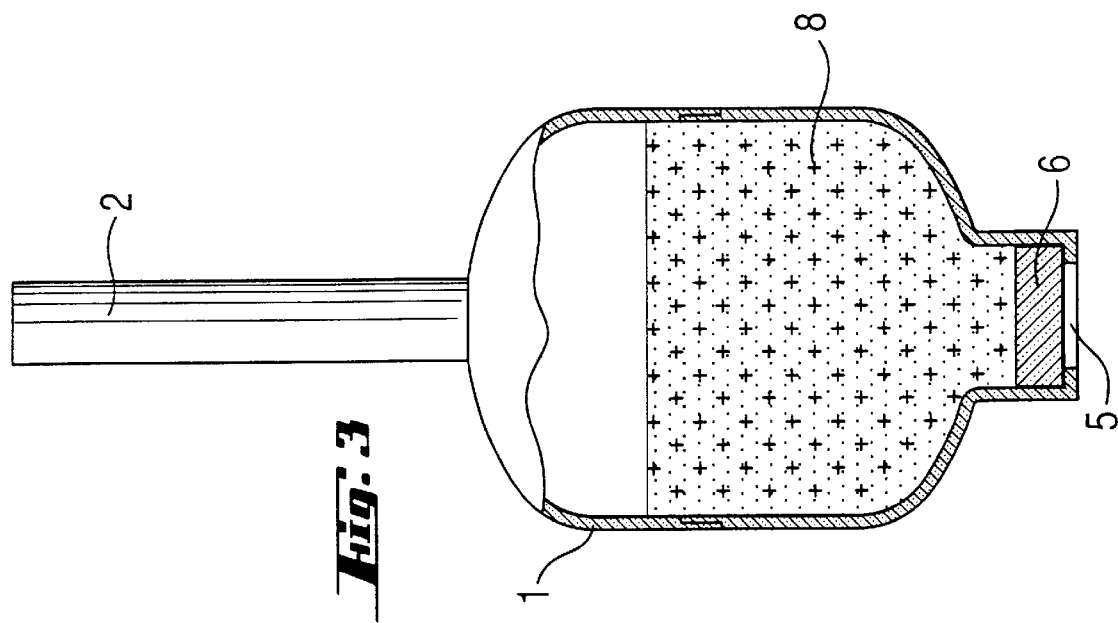
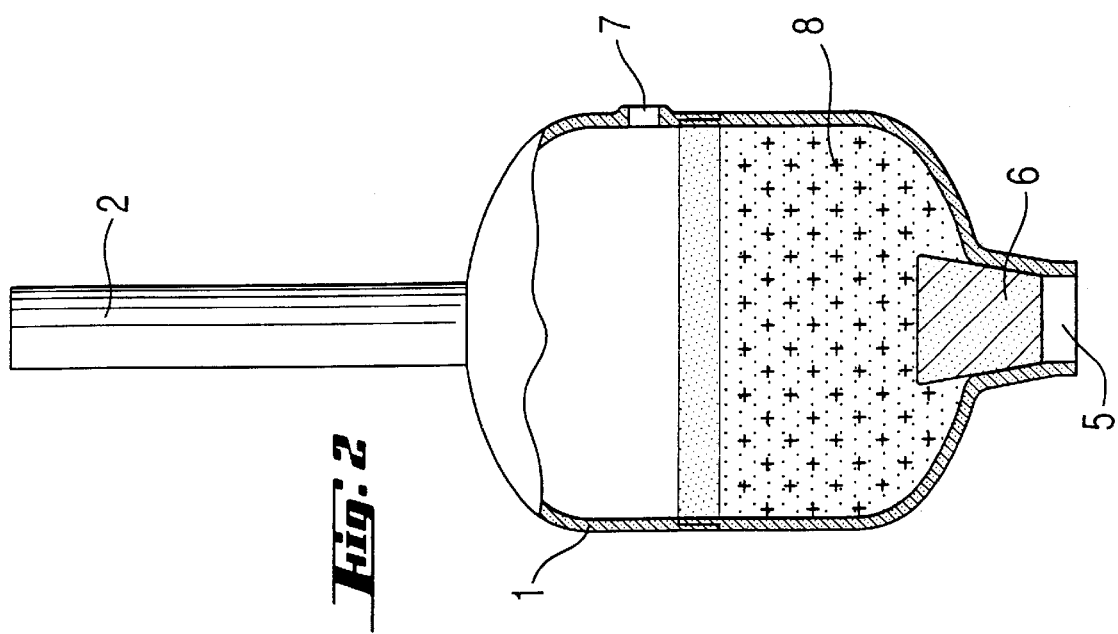

METHOD AND APPARATUS FOR DOPING A MELT WITH A DOPANT

BACKGROUND OF THE INVENTION

1. Field of the Invention

The present invention relates to a method for doping a melt with a dopant, the melt being provided in a crucible. The invention also relates to an apparatus which is suitable for carrying out the method.

2. The Prior Art

The invention is advantageous for the production of single crystals from semiconductor material, which are pulled out of a melt using the Czochralski method and serve as base material for the fabrication of electronic components. The melt generally consists of molten silicon to which a dopant is added. When the dopant is being introduced into the melt, there may be problems with splashing of molten material or the dopant may be difficult to control on account of its volatility. Highly volatile dopants, such as antimony or arsenic, unlike, for example, boron or phosphorus, cannot be melted in the crucible together with polycrystalline semiconductor material. This is because they would evaporate out during the melting process. Therefore, these dopants are usually added only just before the single crystal is pulled from the melt.

Furthermore, the volatility of some dopants causes a series of problems during the pulling operation. Uncontrollable evaporation of the dopant leads to deviations in the resistance and therefore to single crystals which cannot be used. Highly inflammable and generally toxic coatings and particles are deposited in the drawing installation and in the filter system, requiring a considerable outlay on cleaning. If, during the pulling operation, particles fall into the melt, defects may be formed in the crystal, making the single crystal produced unusable. Therefore, it is necessary to use a doping method which involves minimal evaporation losses.

There are already various publications, such as WO-97/36024, JP-62-153188, JP-60-171291 and U.S. Pat. No. 5,406,905, which relate to the doping of a melt. However, none of these publications provides a comprehensive solution to the problems outlined above.

SUMMARY OF THE INVENTION

It is an object of the present invention to provide a solution to problems of this type.

The above object is achieved according to the present invention by providing a method for doping a melt with a dopant, the melt being provided in a crucible, wherein the dopant is introduced into a vessel and the vessel is immersed in the melt, the dopant being transferred into the melt through an opening which forms in the vessel.

The present invention also relates to an apparatus for doping a melt with a dopant, which has a vessel containing the dopant and a device which is connected to the vessel, for lowering the vessel into a melt in a crucible and for lifting the vessel out of the melt, the vessel being provided with an opening which is blocked by a closure piece which is of the same type of material as the melt and melts when it is brought into contact with the melt.

The method can be carried out using all customary dopants. However, it is particularly suitable for doping a melt of semiconductor material, such as silicon, with highly volatile dopants, such as arsenic or antimony. The method and three preferred embodiments of the apparatus are described in more detail below with reference to drawings.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views:

FIG. 1a, FIG. 1b, and FIG. 1c show the temporal sequence of the doping of a melt in accordance with the invention using an apparatus as shown in FIG. 3;

FIG. 2 shows a first embodiment of an apparatus according to the invention which is suitable for carrying out the method;

FIG. 3 shows a second, particularly preferred embodiment of the apparatus according to the invention.

DETAILED DESCRIPTION OF PREFERRED EMBODIMENTS

Figure 4:
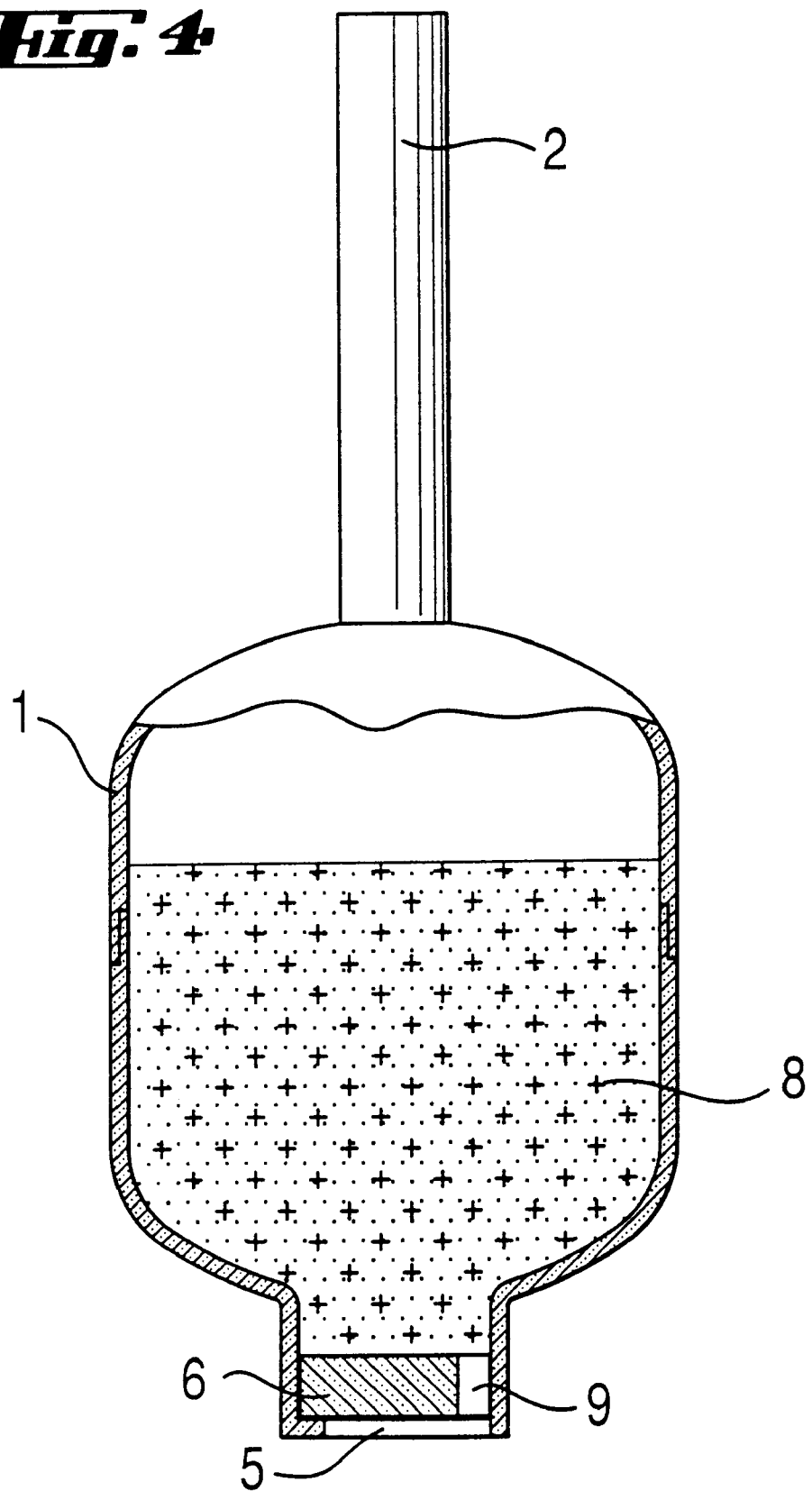
FIG. 4 shows a preferred embodiment for the invention shown in FIG. 3.

Turning now in detail to the drawings, according to the first part (a) in FIG. 1, a vessel 1 is immersed, with the aid of a device 2, in a melt 3 which is situated in a crucible 4. The vessel and the device for lowering and raising the vessel preferably consist of $SiO_2$. The vessel has a first opening 5 which is initially closed and is preferably in the bottom of the vessel but at any rate is in a part of the vessel which becomes immersed in the melt. The vessel contains dopant 8 and, if appropriate, solid material which is of the same type as the melt material. The first opening is closed by a closure piece 6, which is likewise of the same type of material as the melt material. After the vessel has been immersed in the melt, the closure piece melts and dissolves and allows the dopant to be transferred by gravity flow into the melt 3 through the first opening 5.

This situation is illustrated in the second part (b) of the drawing in FIG. 1. The third part-drawing (c) shows how the vessel is then lifted out of the melt and fractions of the melt which have penetrated into the vessel flow back into the crucible.

According to the first embodiment of the apparatus, which is shown in FIG. 2, the vessel 1 is designed as a quartz bell jar which is provided with an additional vent or second opening 7. The vessel is connected to a quartz rod 2, with the aid of which it can be immersed in the melt in crucible 4 and lifted out again. The opening 5 in the bottom of the vessel is closed off by means of a conical shaped stopper 6 which, when the vessel is immersed, dissolves in the melt. The vent or second opening 7 allows the gas pressure which is formed when the vessel is immersed in the melt and some of the dopant begins to sublime to be reduced. To reduce the amount of dopant which evaporates through the vent opening, it is preferable for the dopant in the vessel to be covered with a layer of solid material which is of the same type as the melt material. Moreover, the vent or second opening 7 enables the melt, after immersion of the vessel, to penetrate rapidly into the vessel and mix with the dopant.

There is a risk of residual melt fractions solidifying when the vessel is lifted out of the melt, causing mechanical stresses which may lead to the vessel being destroyed. The vent or second opening 7 also ensures that the melt fractions drain out without leaving any residues when the vessel is removed.

According to the second, particularly preferred embodiment of the apparatus, which is shown in FIG. 3, the vessel 1 is designed as a closed quartz bell jar which has only one, closed opening 5. Surprisingly, despite the closed design, the vessel withstands a build-up of pressure associated with the vessel being immersed in the melt. A quartz rod 2, which can be used to hold and move the vessel, is attached to the vessel. Instead of a vent opening, the vessel has a relatively wide first opening 5 directed toward the melt, through which melt fractions which have penetrated into the vessel can drain out again when the vessel is raised. The first opening 5 is preferably closed by means of a semiconductor wafer as closure piece 6. Furthermore, it is preferable, in this case, for the dopant not to be covered with solid semiconductor material, since in this way, for a given bell jar size, doping can be carried out using relatively high quantities of dopant. The embodiment which has just been portrayed has the final, additional advantage that the dopant can only escape toward the reactive melt and the evaporation losses are particularly low.

Another embodiment of the apparatus of the invention is the device shown in FIG. 4. In vessel 1 a gap 9 is provided between a semiconductor wafer acting as closure piece 6 and the wall 10 of the quartz bell jar 1. Thus the first opening 5 is not completely closed, and also has this advantage. After the vessel has been immersed in the melt, the gap 9 allows rapid penetration of the melt and quick mixing of the melt and the dopant. Minimal time elapses until the dopant is uniformly dispersed in the melt.

The construction of the quartz bell jars shown in the drawings allows complete emptying of the melt residue and dopant residue after the dipping. Melt residues, for example silicon residues, may otherwise destroy the vessel during the solidification. The embodiments shown allow the doping bell jars to be re-used many times, which reduces costs.

Furthermore, the quartz bell jars described also suppress splashing of the melt during the doping operation. Splashes of melt lead to the service lives of the auxiliary materials used being reduced and may cause disruption or unusable crystals during the crystal-pulling operation.

Accordingly, while a few embodiments of the present invention have been shown and described, it is to be understood that many changes and modifications may be made thereunto without departing from the spirit and scope of the invention as defined in the appended claims.

What is claimed is:

1. A method for doping a melt with a dopant comprising, providing a crucible containing a melt;

introducing a dopant into a quartz vessel having a first opening which is directed to the melt;

partly blocking the first opening by means of a semiconductor wafer, thereby narrowing the first opening to form a gap;

immersing the quartz vessel into the melt, the gap allowing rapid penetration of the melt and quick mixing of the melt and the dopant;

dissolving the semiconductor wafer in the melt; and transferring the dopant into the melt through the first opening.

2. The method as claimed in claim 1, comprising covering the dopant with a layer of solid material which is of the same type of material as the melt.

3. The method as claimed in claim 1, wherein the dopant introduced into the vessel is selected from the group consisting of arsenic and antimony.

4. The method as claimed in claim 1, wherein the melt is obtained by melting silicon.

5. The method as claimed in claim 1, wherein said quartz vessel has a wall, and said wall has said first opening.

\* \* \* \* \*